(12) United States Patent
Dalipi

(10) Patent No.: US 8,068,557 B2
(45) Date of Patent: Nov. 29, 2011

(54) IQ-MODULATOR PRE-DISTORTION

(75) Inventor: Spendim Dalipi, Sollentuna (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 1100 days.

(21) Appl. No.: 11/816,854

(22) PCT Filed: Feb. 24, 2005

(86) PCT No.: PCT/SE2005/000266
§ 371 (c)(1),
(2), (4) Date: Aug. 22, 2007

(87) PCT Pub. No.: WO2006/091130
PCT Pub. Date: Aug. 31, 2006

(65) Prior Publication Data
US 2008/0253477 A1 Oct. 16, 2008

(51) Int. Cl.
*H04L 25/49* (2006.01)
(52) U.S. Cl. ........ 375/296; 375/295; 375/297; 375/298; 375/299; 455/63.1; 455/67.13; 455/101; 455/114.2; 455/118; 455/126; 330/149
(58) Field of Classification Search .................. 375/219, 375/295–299; 455/114.3, 118
See application file for complete search history.

(56) References Cited

U.S. PATENT DOCUMENTS

| 6,400,233 | B1 | 6/2002 | Thomas |
| 2002/0018531 | A1 | 2/2002 | Ratto |
| 2002/0191713 | A1* | 12/2002 | McVey .......... 375/308 |
| 2003/0104794 | A1* | 6/2003 | Yang et al. .......... 455/118 |

OTHER PUBLICATIONS

Youngoo Yang; Young Yun Woo; Bumman Kim;, "New predistortion linearizer using low-frequency even-order intermodulation components," Microwave Theory and Techniques, IEEE Transactions on, vol. 50, No. 2, pp. 446-452, Feb. 2002.*
Youngoo Yang; Young Yun woo; Bumman Kim;, "New Predistortion linearizer using low-frequency even-order intermodulation components," Microwave Theory and Techniques, IEEE Transactions on, vol. 50, No. 2, pp. 446-452, Feb. 2002.*
Spilker, J.:"Digital Communications by Satellite", translation by V.V. Markov, Moscow, 1979, pp. 373-386.
Youngoo, Yang et al: "New Predistortion Linearization Using Low-Frequency Even-Order Intermodulation Components" Microwave Theory and Techniques, IEEE Transactions, Feb. 2002, vol. 50, iss. 2, pp. 446-452.

* cited by examiner

*Primary Examiner* — Khanh C Tran
*Assistant Examiner* — Eboni Hughes

(57) ABSTRACT

An IQ-modulator pre-distorter includes an iteratively updated digital filter ($gQ_0$, $gQ_1$) for filtering one of the branches of an IQ-signal to compensate for IQ-modulator generated amplitude errors. An iteratively updated digital filter ($cQI_0$, $cQI_1$), cross-connected from one of the branches to the other branch, filters one of the components of an IQ-signal to compensate for IQ-modulator generated intermodulation between the branches. Iteratively updated compensators (dcI, dcQ) counteract IQ-modulator generated offset errors.

13 Claims, 7 Drawing Sheets

IQ-MODULATOR PRE-DISTORTION

TECHNICAL FIELD

The present invention relates generally to an apparatus for compensating and linearizing a non-linear IQ-modulator (I=In-phase, Q=Quadrature phase).

BACKGROUND

A direct-IQ radio architecture comprises base band data modification, digital-to-analog conversion (DAC), and analog IQ-quadrature modulation to finally bring a complex I+jQ signal to radio frequency (RF). The IQ-modulator exhibits a DC-component, an amplitude error and also a phase error. Both of the branches (I and Q) of the IQ-modulator suffer from this imbalance.

In order to get a better power budget in the direct-IQ radio architecture for digital pre-distortion (to compensate for imperfections of the power amplifier), the analog IQ-modulator is foreseen to be driven by a higher input power. As a result, the mixer parts of the IQ-modulator tend to become inherently non-linear on top of the linear amplitude and phase imbalance.

Today, no specific solution exists as how to linearize an IQ-modulator. Absence of a linearizer gives rise to added unwanted signal inter-modulation due to high power usage of the IQ-modulator. There is a need to counteract the non-linearities in order to meet specifications and at the same time keep a good power efficiency budget.

SUMMARY

An object of the present invention is an IQ-modulator pre-distorter for compensating for these errors.

A further object is a base station including such an IQ-modulator pre-distorter.

These objects are achieved in accordance with the attached claims.

Briefly, the present invention solves this problem by using separate iteratively updated digital filters to compensate for amplitude errors and intermodulation errors and iteratively updated offset compensators.

BRIEF DESCRIPTION OF THE DRAWINGS

The invention, together with further objects and advantages thereof, may best be understood by making reference to the following description taken together with the accompanying drawings, in which.

DETAILED DESCRIPTION

The following description will concentrate only on elements that are relevant for explaining the present invention. Other elements, such as filters, signal encoders, channel encoders, etc., which are obvious for a person skilled in the art have been omitted to avoid cluttering of the drawings.

Figure 1:
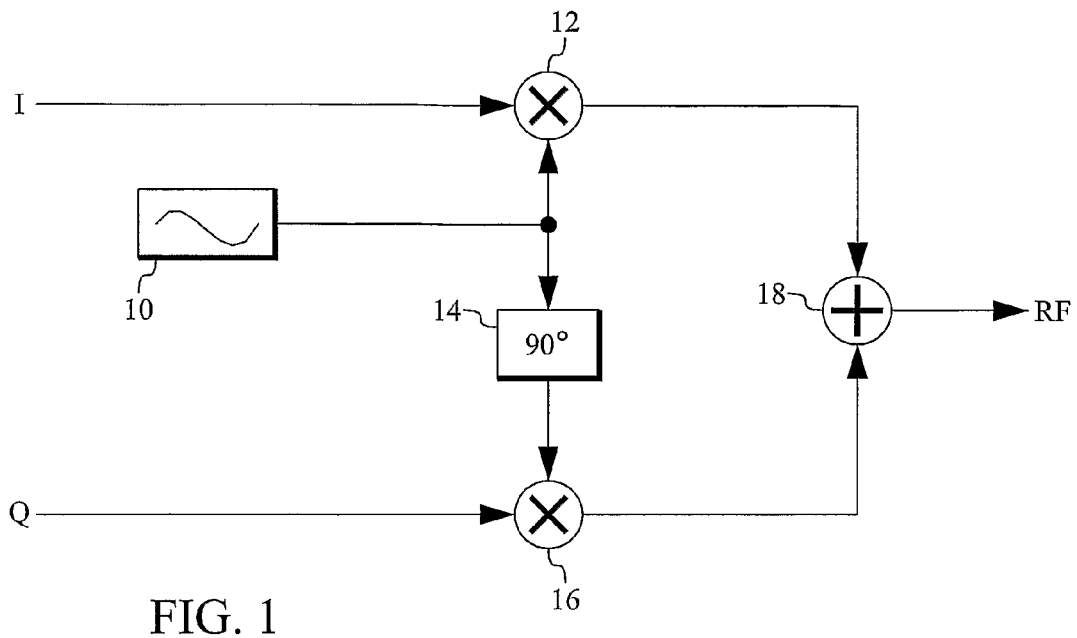
FIG. 1 is a simple block diagram illustrating the principles of an IQ-modulator.

FIG. 1 is a block diagram of an analog IQ-modulator. The IQ-modulator includes a local oscillator 10, the output signal of which multiplies the I-component of a signal that is to be transformed to RF in a mixer 12. The output signal from local oscillator 10 is also forwarded to a 90° phase shifter 14 and then to a second mixer 16 for transforming the Q-component of the input signal to RF. The transformed signals from mixers 12, 16 are then combined in an adder 18 to form the desired RF-signal.

Since the two local oscillator signals are phase shifted 90°, the two components can be regarded as being "orthogonal". If, however, there is an error in the phases of the mixing signals from the local oscillator and also a gain difference, then the I- and Q-branches are not orthogonal any longer. This will lead to leakage between the branches.

In addition to the pure orthogonality imbalance, each branch has non-linear effects. It is believed that these come from phase-modulation of the mixing signals from the local oscillator.

Figure 2:
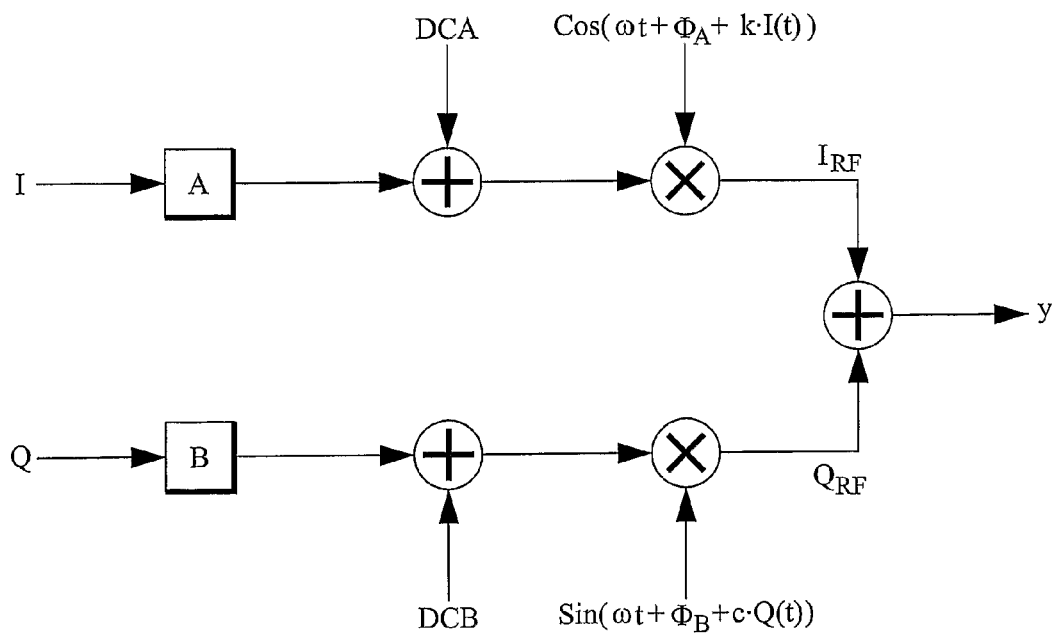
FIG. 2 is a model of an IQ-modulator illustrating various error sources.

FIG. 2 is a simple example model of an IQ-modulator illustrating various possible error sources. In this model the I-component is amplified by a gain A, combined with a DC offset DCA and multiplied by a mixer signal $\cos(\omega \cdot t + \Phi_A + k \cdot I(t))$ to produce the transformed or up-converted RF-signal $I_{RF}$. The up-conversion of the Q-component is modeled in a similar way. Mathematically the model can be expressed as:

$$\begin{cases} I_{RF}(t) = (I(t) \cdot A + DCA) \cdot \cos(\omega \cdot t + \Phi_A + k \cdot I(t)) \\ Q_{RF}(t) = (Q(t) \cdot B + DCB) \cdot \sin(\omega \cdot t + \Phi_B + c \cdot Q(t)) \end{cases} \quad (1)$$

The up-converted signals are then combined to form the RF-signal:

$$y(t) = I_{RF}(t) + Q_{RF}(t) \quad (2)$$

Basically the IQ-modulator is seen as having two input ports that each have their own non-linearity. As there are two separate branches, it is necessary to have two separate non-linear compensators for this. In view of FIG. 2 the local oscillator signals each have a phase modulation, which gives frequency inter-modulation on the I- and Q-signals (the phase offsets that include the k and c factors).

As will be shown below, the IQ-modulator errors can be counteracted by digitally pre-distorting the IQ-signal at base band using iteratively updated filter structures in which the filter taps depend on the values of the I- and Q-components. These filter structures may, for example, be updated in accordance with the LMS-algorithm (Least Mean Squares) as:

$$\begin{cases} gI_{q,i+1}(b) = gI_{q,i}(b) + \mu_{gI}(b) \cdot \dfrac{1}{N} \displaystyle\sum_{\substack{|x_{k-d(q)}| \in M_b}}^{N} \mathrm{Re}\{x_{k-d(q)}\} \cdot (\mathrm{Re}\{x_k\} - \mathrm{Re}\{y_k\}) \\ gQ_{q,i+1}(b) = gQ_{q,i}(b) + \mu_{gQ}(b) \cdot \dfrac{1}{N} \displaystyle\sum_{\substack{|x_{k-d(q)}| \in M_b}}^{N} \mathrm{Im}\{x_{k-d(q)}\} \cdot (\mathrm{Im}\{x_k\} - \mathrm{Im}\{y_k\}) \end{cases} \quad (3)$$

$q = 0, \ldots, M$ $$\begin{cases} cIQ_{q,i+1}(b) = cIQ_{q,i}(b) + \mu_{cIQ}(b) \cdot \dfrac{1}{N} \displaystyle\sum_{\substack{|x_{k-d(q)}| \in M_b}}^{N} \mathrm{Im}\{x_{k-d(q)}\} \cdot (\mathrm{Re}\{x_k\} - \mathrm{Re}\{y_k\}) \\ cQI_{q,i+1}(b) = cQI_{q,i}(b) + \mu_{cQI}(b) \cdot \dfrac{1}{N} \displaystyle\sum_{\substack{|x_{k-d(q)}| \in M_b}}^{N} \mathrm{Re}\{x_{k-d(q)}\} \cdot (\mathrm{Im}\{x_k\} - \mathrm{Im}\{y_k\}) \end{cases} \quad (4)$$

$q = 0, \ldots, K$ $$\begin{cases} dcI_{i+1} = dcI_i + \mu_{dc} \cdot \dfrac{1}{N} \displaystyle\sum_{k=1}^{N} (\mathrm{Re}\{x_k\} - \mathrm{Re}\{y_k\}) \\ dcQ_{i+1} = dcQ_i + \mu_{dc} \cdot \dfrac{1}{N} \displaystyle\sum_{k=1}^{N} (\mathrm{Im}\{x_k\} - \mathrm{Im}\{y_k\}) \end{cases} \quad (5)$$

Here equation (3) represents filter taps $gIQ$, $gQ_q$ for filtering the I- and Q-components to compensate for amplitude errors generated by the IQ-modulator without regard to the inter-modulation error. The inter-modulation is handled by the filter taps $gIQ_q$, $gQI_q$ in equation (4), and offset errors are handled by $dcI$, $dcQ$ in equation (5).

In equations (3)-(5) $x_k$ and $y_k$ represent the IQ-modulator pre-distorter input signal (reference signal) and a down-converted IQ-modulator output signal, respectively. These signals will be further illustrated in FIG. 4. It is noted that these signals are regarded as complex, i.e. they have a real part and an imaginary part (corresponding to the I- and Q-components). The $x_k$ and $y_k$ signals are also assumed to be time synchronized and phase-locked.

Furthermore, in equations (3)-(5)

q is an index representing a delay d(q), the various μ:s are loop constants b identifies a filter tap bin, i is an iteration index, N is the number of input samples of reference signal x in a sample batch that have an amplitude that falls within a window $M_b$ around the center amplitude of bin b, M, K represent the number of filter taps +1.

In equations (3)-(4) a different number (M+1 and K+1, respectively) of filter taps is used. However, it is also feasible to use the same number of filter taps for $gIQ$, $gQ_q$ and $gIQ_q$, $gQI_q$. Furthermore, It is also possible to have different windows $M_b$ for the two cases. A simplification can be obtained by letting each (or at least some) of the loop constants be independent of the bin b.

Furthermore, in the extreme case where b covers the entire range of I and Q, the filter taps will be independent of the current values of the input signals (for example $gI_q(b)$ will not depend on b). As indicated by index q, the delay d(q) depends on q. In the simplest embodiment d(q) is simply set to q. Other embodiments may use multiples of q.

Figure 3:
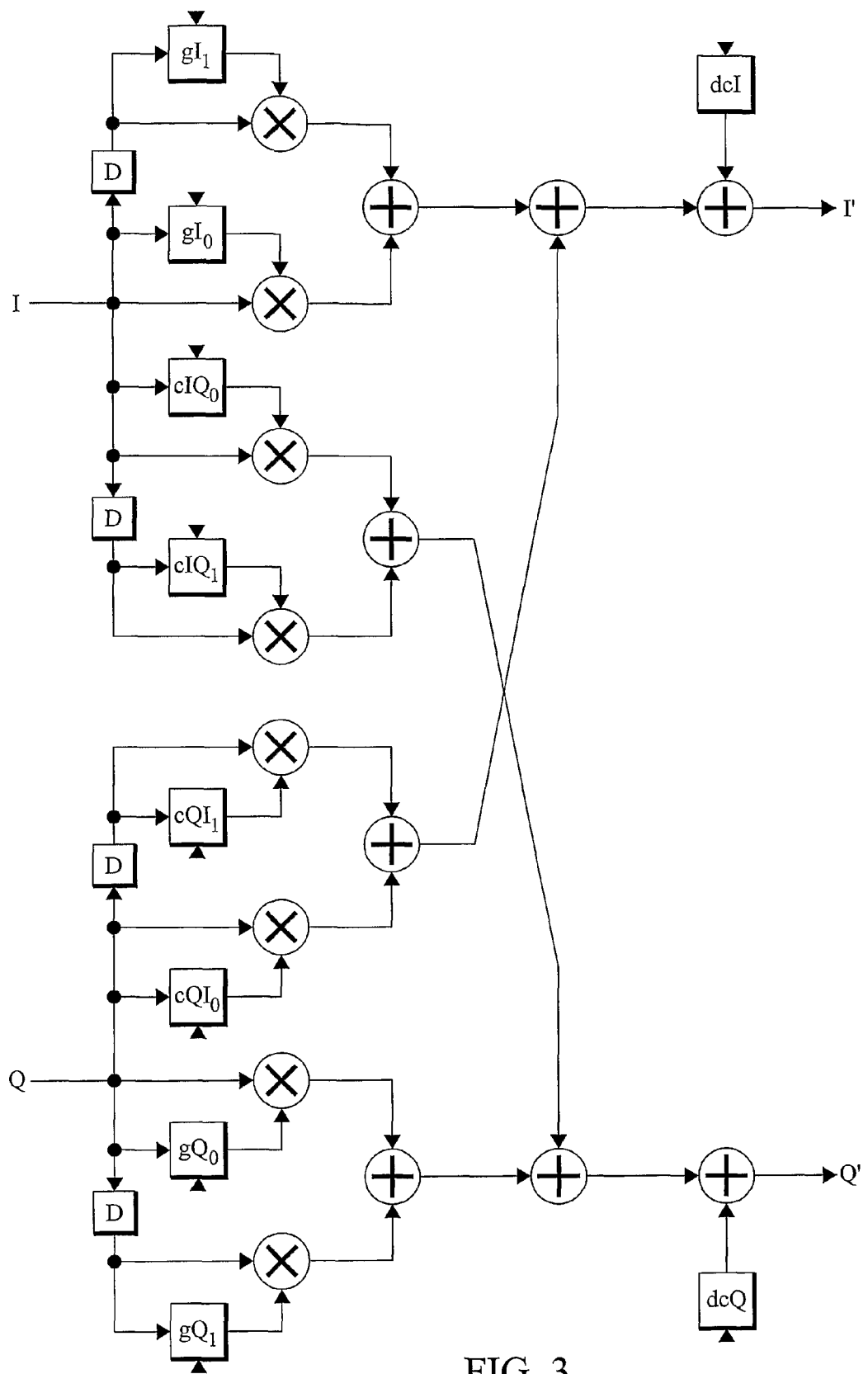
FIG. 3 is a block diagram of a first embodiment of an IQ-modulator pre-distorter in accordance with the present invention.

FIG. 3 is a block diagram of a first embodiment of an IQ-modulator pre-distorter in accordance with the present invention based on equations (3)-(5). In this embodiment there are only 2 filter taps (M=1) to avoid cluttering of the drawing. However, it is appreciated that more filter taps are feasible in a practical embodiment. The I-component is multiplied by filter tap $gI_0$, the value of which depends on the value of the I-component itself. The I-component is also forwarded to a delay element D, and the delayed signal is multiplied by filter tap $gI_1$, the value of which depends on the value of the delayed I-component itself. The multiplied signals are then added. The I-component is processed in a similar way by filter taps $gIQ_0$, $gIQ_1$. However, the resulting signal is not maintained in the I-branch. Instead it is cross-coupled over to the Q-branch, where it is added to the Q-component after the latter has been filtered by filter taps $gQ_0$, $gQ_1$. Similarly, a cross-coupled signal from the Q-branch is added to the filtered I-component. Finally, the off-sets dcI, dcQ are added to the I- and Q-branch, respectively.

Figure 4:
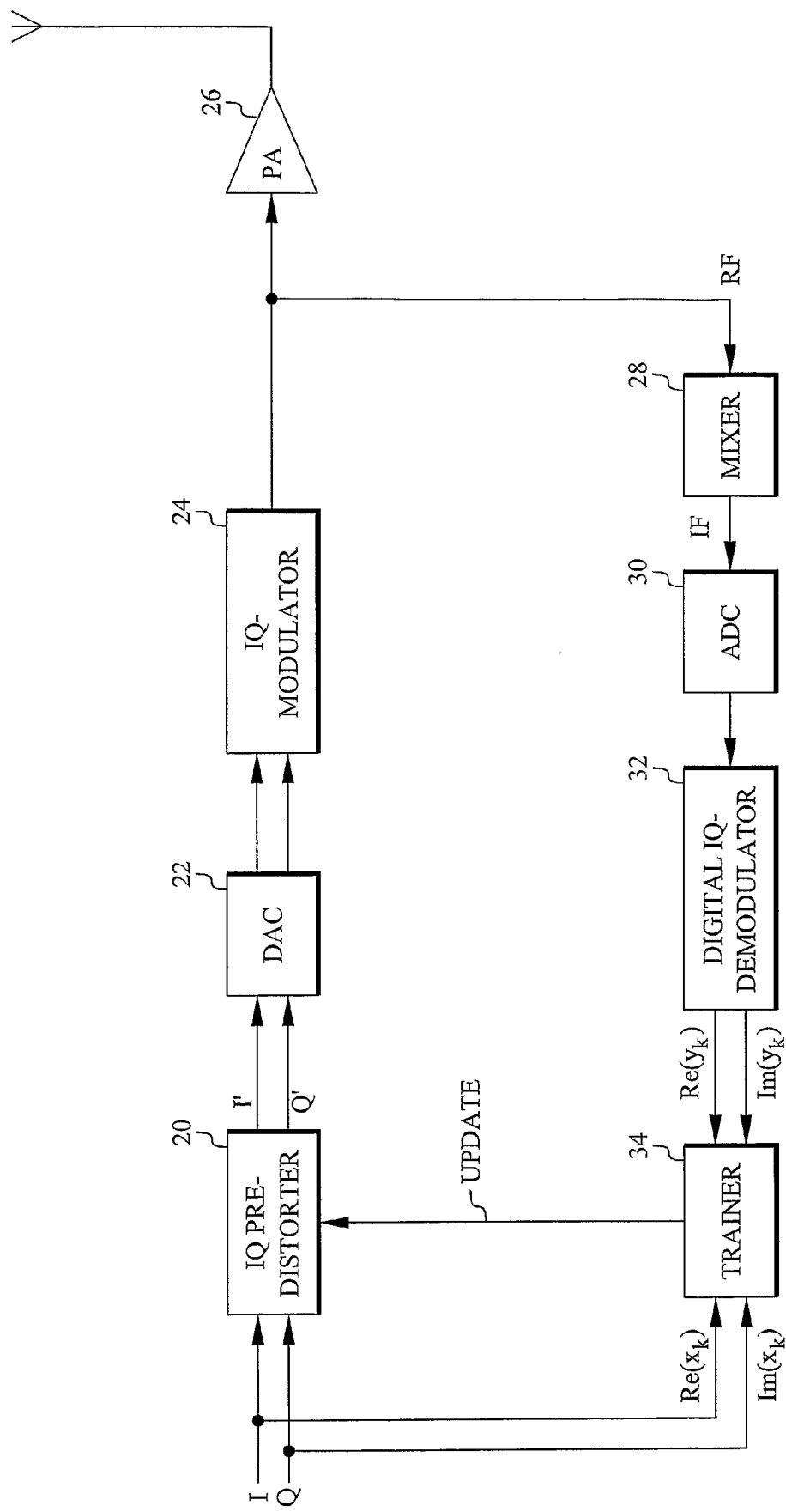
FIG. 4 is a block diagram of a first embodiment of a base station including an IQ-modulator pre-distorter in accordance with the present invention.

FIG. 4 is a block diagram of a first embodiment of a base station including an IQ-modulator pre-distorter in accordance with the present invention. An IQ-modulator pre-distorter 20 is connected to a DAC 22 (Digital-to-Analog Converter). The analog pre-distorted IQ-vector is forwarded to an IQ-modulator 24, and the up-converted RF-signal is amplified by a power amplifier 26 for transmission by an antenna. The output of IQ-modulator 24 is also connected to a mixer 28, which down-converts the RF-signal to IF (Intermediate Frequency). The IF-signal is digitized in an ADC 30 (Analog-to-Digital Converter). The digitized IF-signal is further down-converted and transformed into an IQ-signal by a digital IQ-demodulator 32. IQ-demodulator 32 is connected to a pre-distorter trainer 34 for determining the actual pre-distortion. The complex input signals $x_k$ and $y_k$ to trainer 34 have been indicated in FIG. 4. After determining the pre-distortion, for example in accordance with the procedure described by equations (3)-(5), trainer 34 forwards the filter taps to pre-distorter 20. The filter taps may be updated every sample period or at more spaced time intervals. The updating of the filter taps has been indicated by the unconnected arrows on the taps in FIG. 3.

In FIG. 4 it is noted that there is a power amplifier 26. Since a power amplifier also is a non-ideal component, it is desirable to compensate for errors generated by the amplifier by including a power amplifier pre-distorter. Any suitable power amplifier pre-distorter may be used for this purpose. However, such a pre-distorter may also be based on iterative methods, such as LMS algorithms. For example, it may use complex filter taps based on the following equations:

$$T_{q,i+1}(b) = T_{q,i}(b) + \mu_q(b) \cdot \frac{1}{N} \sum_{|x_{k-q}| \in M_b}^{N} (x_k - y_k) \cdot x_{k-q}^* \quad (6)$$

$$q = 0, \ldots, L$$

where "*" denotes complex conjugation.

Although L is used to represent the number of filter taps (which is L+1), it is appreciated that the number of taps can be the same as in one of equations (3)-(4) (or in both equations if M=K. Furthermore, the window $M_b$ need not be the same as for the IQ-modulator pre-distorter. A simplification can be obtained by letting each (or at least some) of the loop constants be independent of the bin b.

Figure 5:
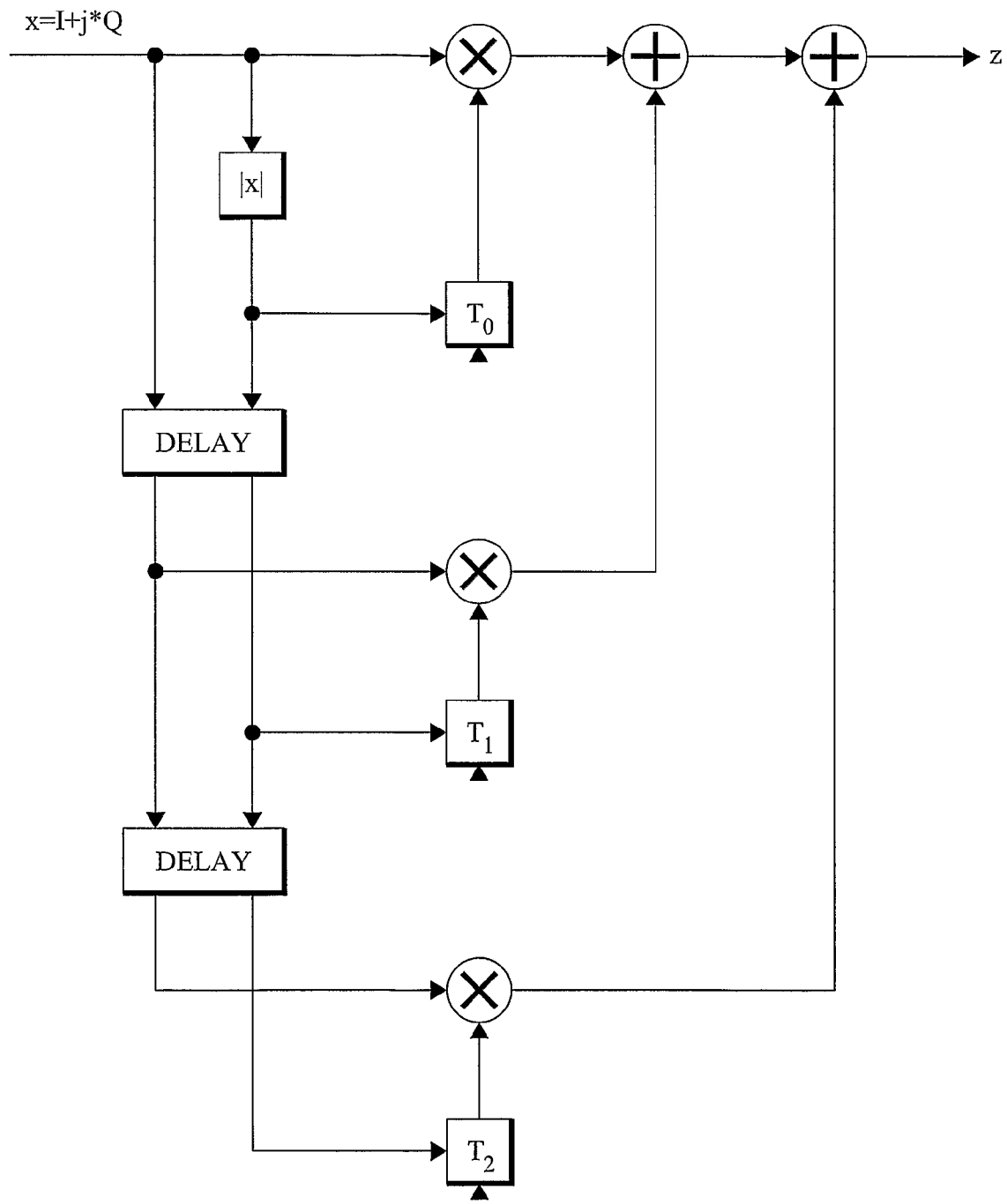
FIG. 5 is a block diagram of an embodiment of a power amplifier pre-distorter suitable for use in a second embodiment of a base station in accordance with the present invention.

FIG. 5 is a block diagram of an embodiment of a power amplifier pre-distorter suitable for use in a second embodiment of a base station in accordance with the present invention. This power amplifier pre-distorter is based on filter taps determined, for example, in accordance with equation (6). In this example the filter includes 3 filter taps. A complex input signal x=I+JQ is multiplied by the first filter tap $T_0$, the value of which is determined by the amplitude |x| of the input signal. The input signal x and its amplitude |x| are delayed and the delayed signal is multiplied by filter tap $T_1$, the valued of which is determined by the delayed amplitude. After a further delay another multiplication is performed by $T_1$. Thereafter the multiplied signals are added to each other to form a signal z that is pre-distorted to counteract errors generated by a power amplifier. The updating of the filter taps has been indicated by the unconnected arrows on the taps in FIG. 5.

Figure 6:
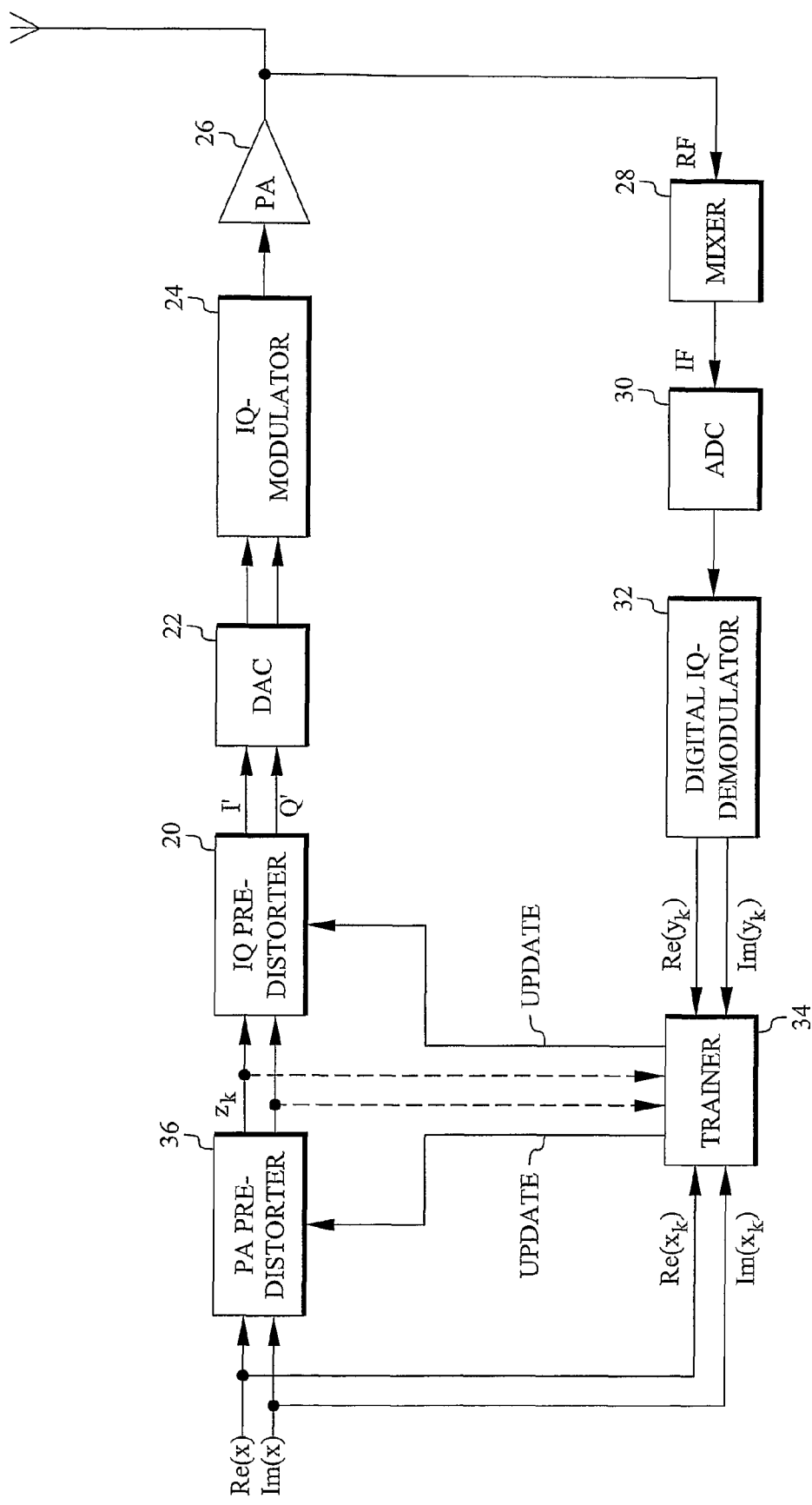
FIG. 6 is a block diagram of a second embodiment of a base station including an IQ-modulator pre-distorter in accordance with the present invention.

FIG. 6 is a block diagram of a second embodiment of a base station including an IQ-modulator pre-distorter in accordance with the present invention. This embodiment integrates IQ-modulator pre-distorter 20 with a power amplifier pre-distorter 34 in the same control loop. Power amplifier pre-distorter may, for example, be implemented as in FIG. 5. It is noted that in this case the RF-signal that is down-converted to trainer 34 is taken from the power amplifier output instead of the IQ-modulator output. Furthermore, trainer 34 now updates both pre-distorters.

In one embodiment trainer 34 may update the various filter taps in accordance with equations (3)-(6). However, it has been found that the integrated control loop in FIG. 6 works even better if equations (3)-(4) as slightly modified to:

$$\begin{cases} gI_{q,i+1}(b) = gI_{q,i}(b) + \mu_{gI}(b) \cdot \frac{1}{N} \sum_{|z_{k-d(q)}| \in M_b}^{N} \operatorname{Re}\{x_{k-d(q)}\} \cdot (\operatorname{Re}\{x_k\} - \operatorname{Re}\{y_k\}) \\ gQ_{q,i+1}(b) = gQ_{q,i}(b) + \mu_{gQ}(b) \cdot \frac{1}{N} \sum_{|z_{k-d(q)}| \in M_b}^{N} \operatorname{Im}\{x_{k-d(q)}\} \cdot (\operatorname{Im}\{x_k\} - \operatorname{Im}\{y_k\}) \end{cases} \quad (7)$$

$$q = 0, \ldots, M$$

$$\begin{cases} cIQ_{q,i+1}(b) = cIQ_{q,i}(b) + \mu_{cIQ}(b) \cdot \frac{1}{N} \sum_{|z_{k-d(q)}| \in M_b}^{N} \operatorname{Im}\{x_{k-d(q)}\} \cdot (\operatorname{Re}\{x_k\} - \operatorname{Re}\{y_k\}) \\ cQI_{q,i+1}(b) = cQI_{q,i}(b) + \mu_{cQI}(b) \cdot \frac{1}{N} \sum_{|z_{k-d(q)}| \in M_b}^{N} \operatorname{Re}\{x_{k-d(q)}\} \cdot (\operatorname{Im}\{x_k\} - \operatorname{Im}\{y_k\}) \end{cases} \quad (8)$$

$$q = 0, \ldots, M$$

The difference is that the output signal z from power amplifier pre-distorter 36, instead of input signal x, is used to determine whether a sample is included in interval $M_b$ or not. In the actual summation, however, input signal x is still used. One reason for this modification is that it handles IQ-modulator non-linearities better than the original equations (3)-(4). In FIG. 6 this possible modification has been indicated by the dashed lines to trainer 34.

To prevent from overcompensation and competition between the algorithms, one of the gain parameters (gI or gQ) and one of cross coupling parameters (cIQ or cQI) may be set to constants. This divides the responsibility between the power amplifier pre-distorter and the IQ-modulator pre-distorter. The IQ compensation becomes a slave and is only compensating the error in the difference between I-signal and Q-signal. The power amplifier pre-distorter will have the main responsibility for gain, phase and linearization compensation.

Figure 7:
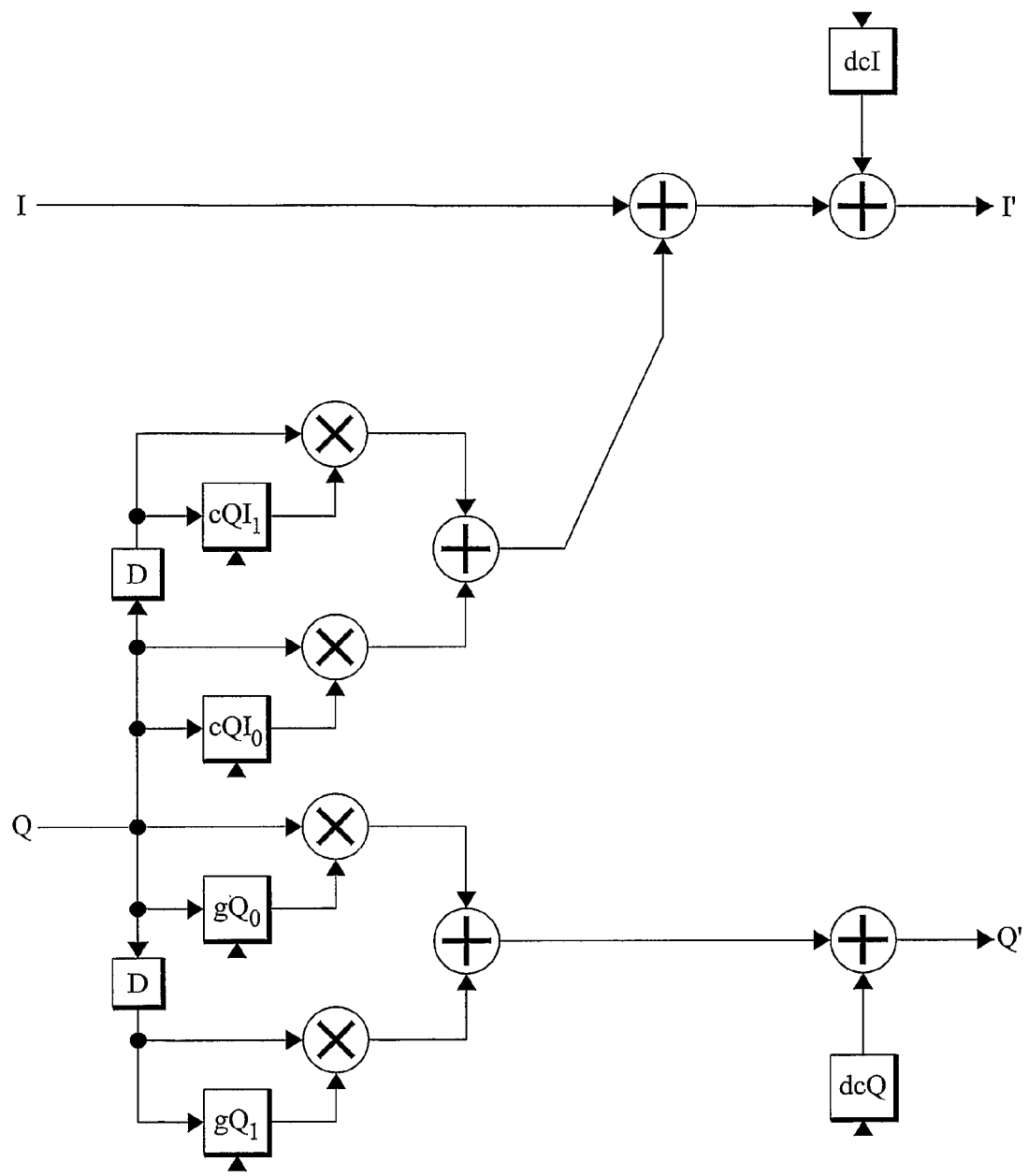
FIG. 7 is a block diagram of a second embodiment of an IQ-modulator pre-distorter in accordance with the present invention.

FIG. 7 is a block diagram of a second embodiment of an IQ-modulator pre-distorter in accordance with the present invention based on the comments in the previous paragraph. This simplified embodiment can be used in the base station in FIG. 6 instead of the embodiment of FIG. 3. For the IQ-modulator pre-distorter in FIG. 7 equations (3)-(4) are reduced to:

$$\begin{cases} gI_{q,i}(b) = 1 \\ gQ_{q,i+1}(b) = gQ_{q,i}(b) + \mu_{gQ}(b) \cdot \frac{1}{N} \sum_{|z_{k-d(q)}| \in M_b}^{N} \operatorname{Im}\{x_{k-d(q)}\} \cdot (\operatorname{Im}\{x_k\} - \operatorname{Im}\{y_k\}) \end{cases} \quad (9)$$

$$q = 0, \ldots, M$$

-continued $$\begin{cases} cIQ_{q,i}(b) = 0 \\ cQI_{q,i+1}(b) = cQI_{q,i}(b) + \mu_{cQI}(b) \cdot \frac{1}{N} \sum_{\substack{|z_{k-d(q)}| \in M_b}}^{N} \text{Re}\{x_{k-d(q)}\} \cdot (\text{Im}\{x_k\} - \text{Im}\{y_k\}) \end{cases} \quad (10)$$

$$q = 0, \ldots, M$$

However, it should be noted that since there is no significant difference between the I- and Q-components of an IQ-signal, the roles of I and Q may be reversed in FIG. 7 and equations (9)-(10).

Figure 8:
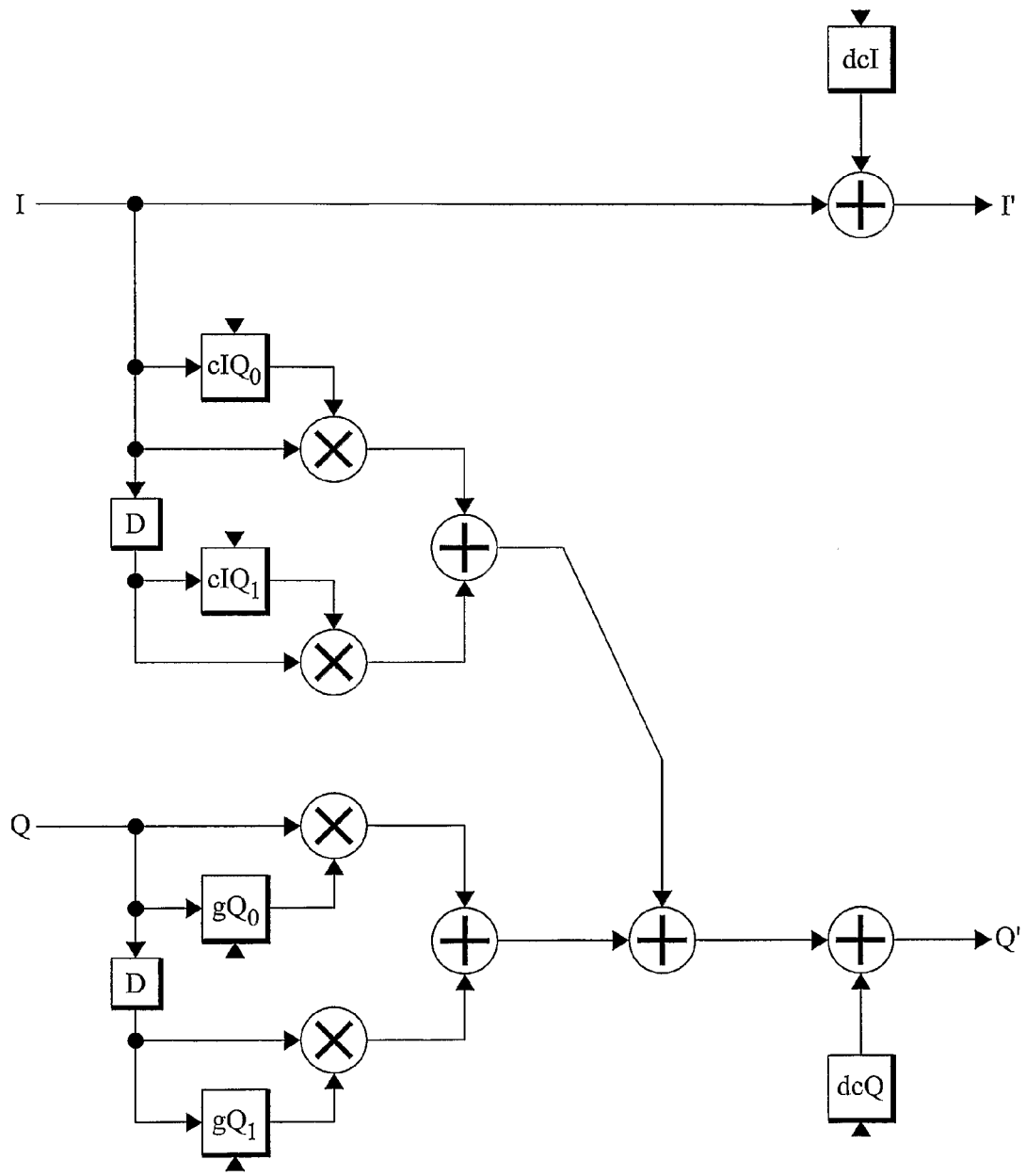
FIG. 8 is a block diagram of a third embodiment of an IQ-modulator pre-distorter in accordance with the present invention.

FIG. 8 is a block diagram of a third embodiment of an IQ-modulator pre-distorter in accordance with the present invention. This embodiment differs from the embodiment in FIG. 7 by having a cross-connected digital filter from the I-branch to the Q-branch instead of from the Q-branch to the I-branch. In this embodiment equation (10) is replaced by:

$$\begin{cases} cIQ_{q,i+1}(b) = cIQ_{q,i}(b) + \mu_{cIQ}(b) \cdot \frac{1}{N} \sum_{\substack{|z_{k-d(q)}| \in M_b}}^{N} \text{Im}\{x_{k-d(q)}\} \cdot (\text{Re}\{x_k\} - \text{Re}\{y_k\}) \\ cQI_{q,i}(b) = 0 \end{cases} \quad (11)$$

$$q = 0, \ldots, M$$

The IQ-modulator pre-distorter in accordance with the present invention may be implemented as an FPGA (Field Programmable Gate Array) or ASIC (Application Specific Integrated Circuit). Another possibility is to use a micro processor or a micro/signal processor combination and corresponding soft-ware.

The filters can also be made symmetric with both positive and negative delays.

The invention described above has several advantages:

There is no need to model the system.

The necessary calculations are simple.

The implementation is cost efficient.

IQ-modulator error compensation is possible for large bandwidth signals.

It will be understood by those skilled in the art that various modifications and changes may be made to the present invention without departure from the scope thereof, which is defined by the appended claims.

The invention claimed is:

1. An IQ-modulator pre-distorter, comprising:
an iteratively updated digital filter ($gQ_0$, $gQ_1$) for filtering one of the branches of an IQ-signal to compensate for IQ-modulator generated amplitude errors;
an iteratively updated digital filter ($cQI_0$, $cQI_1$), cross-connected from one of the branches to the other branch, for filtering one of the components of an IQ-signal to compensate for IQ-modulator generated inter-modulation between the branches;
iteratively updated offsets compensators (dcI, dcQ) to compensate for IQ-modulator generated offset errors; and
wherein the iteratively updated digital filters are iteratively updated by a trainer that determines an actual pre-distortion of the IQ-signal.

2. The pre-distorter of claim 1, including two iteratively updated digital filters ($gQ_0$, $gQ_1$, $gI_0$, $gI_1$) for filtering each branch of the IQ-signal to compensate for IQ-modulator generated amplitude errors in each branch.

3. The pre-distorter of claim 1, including two iteratively updated digital filter ($cQI_0$, $cQI_1$, $cIQ_0$, $cIQ_1$), cross-connected from a respective branch to the other branch, for filtering both IQ-signal components to compensate for IQ-modulator generated inter-modulation between the branches.

4. The pre-distorter of claim 1, wherein each filter tap is implemented as a lookup table, the filter tap value of which depends on the value of the signal it multiplies.

5. A combined power amplifier and IQ-modulator pre-distorter, including a power amplifier pre-distorter connected to an IQ modulator pre-distorter in accordance with claim 1.

6. The combined pre-distorter of claim 5, wherein the power amplifier pre-distorter includes an iteratively updated complex filters ($T_q$), the filter taps of which are implemented as lookup tables, whereby each filter tap value depends on the amplitude of the signal it multiplies.

7. A base station including are IQ-modulator pre-distorter, said IQ-modulator pre-distorter comprising:
an iteratively updated digital filter ($gQ_0$, $gQ_1$) for filtering one of the branches of an IQ-signal to compensate for IQ-modulator generated amplitude errors;
an iteratively updated digital filter ($cQI_0$, $cQI_1$), cross-connected from one of the branches to the other branch, for filtering one of the components of an IQ-signal to compensate for IQ-modulator generated inter-modulation between the branches;
iteratively updated offsets compensators (dcI, dcQ) to compensate for IQ-modulator generated offset errors; and
wherein the iteratively updated digital filters are iteratively updated by a trainer that determines an actual pre-distortion of the IQ-signal.

8. The base station of claim 7, including two iteratively updated digital filters ($gQ_0$, $gQ_1$, $gI_0$, $gI_1$) for filtering each branch of the IQ-signal to compensate for IQ-modulator generated amplitude errors in each branch.

9. The base station of claim 7, including two iteratively updated digital filter ($cQI_0$, $cQI_1$, $cIQ_0$, $cIQ_1$), cross-connected from a respective branch to the other branch, for filtering both IQ-signal components to compensate for IQ-modulator generated inter-modulation between the branches.

10. The base station of claim 7, wherein each filter tap is implemented as a lookup table, the filter tap value of which depends on the value of the signal it multiplies.

11. A base station including a combined power amplifier and IQ-modulator pre-distorter, said combined pre-distorter including a power amplifier pre-distorter connected to an IQ modulator pre-distorter in accordance with claim 7.

12. The base station of claim 11, wherein the power amplifier pre-distorter includes an iteratively updated complex filters ($T_q$), the filter taps of which are implemented as lookup tables, whereby each filter tap value depends on the amplitude of the signal it multiplies.

13. The pre-distorter of claim 1, wherein the pre-distorter is compensating for both non-linearities and frequency dependencies in the IQ-modulator.

\* \* \* \* \*